United States Patent
Wang et al.

(10) Patent No.: US 10,847,566 B2
(45) Date of Patent: Nov. 24, 2020

(54) HIGH COLOR RENDERING WHITE LIGHT EMITTING DEVICES AND HIGH COLOR RENDERING PHOTOLUMINESCENCE COMPOSITIONS

(71) Applicant: Intematix Corporation, Fremont, CA (US)

(72) Inventors: Gang Wang, Sunnyvale, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/403,723

(22) Filed: May 6, 2019

(65) Prior Publication Data

US 2019/0371851 A1    Dec. 5, 2019

Related U.S. Application Data

(60) Provisional application No. 62/667,351, filed on May 4, 2018.

(51) Int. Cl.
*H01L 27/146* (2006.01)
*C09K 11/08* (2006.01)
(Continued)

(52) U.S. Cl.
CPC .... *H01L 27/14645* (2013.01); *C09K 11/0883* (2013.01); *C09K 11/572* (2013.01);
(Continued)

(58) Field of Classification Search
None
See application file for complete search history.

(56) References Cited

U.S. PATENT DOCUMENTS

| 7,497,973 B2 | 3/2009 | Radkov et al. |
| 8,890,403 B2 | 11/2014 | Sakuta et al. |

(Continued)

FOREIGN PATENT DOCUMENTS

| EP | 2629341 | 3/2016 |
| EP | 3188262 B1 | 12/2018 |
| WO | 2013003166 A1 | 1/2013 |

OTHER PUBLICATIONS

Piao, Xianqing, et al. "Preparation of CaAlSiN3:Eu2+Phosphors by the Self-Propagating High-Temperature Synthesis and Their Luminescent Properties." Chemistry of Materials, vol. 19, No. 18, 2007, pp. 4592-4599., doi:10.1021/cm070623c. (Year: 2007).*

(Continued)

*Primary Examiner* — J. E. Schoenholtz

(57) ABSTRACT

A exemplary light emitting device includes an excitation source operable to generate excitation light with a dominant wavelength in a range 450 nm to 470 nm; a red photoluminescence material which generates light with a peak emission wavelength in a range 600 nm to 620 nm with a full width at half maximum emission intensity greater than 70 nm and less than 80 nm; a yellow to green photoluminescence material which generates light with a peak emission wavelength in a range 530 nm to 550 nm; and a narrow-band red photoluminescence material which generates light with a peak emission wavelength in a range 625 nm to 635 nm with a full width at half maximum emission intensity greater than about 5 nm and less than about 25 nm.

9 Claims, 5 Drawing Sheets

(51) Int. Cl.
  *C09K 11/57* (2006.01)
  *C09K 11/77* (2006.01)
  *H01L 27/15* (2006.01)

(52) U.S. Cl.
  CPC ...... *C09K 11/7774* (2013.01); *C09K 11/7792* (2013.01); *H01L 27/15* (2013.01)

(56) References Cited

U.S. PATENT DOCUMENTS

| | | | |
|---|---|---|---|
| 10,462,870 B2* | 10/2019 | Qiang | H05B 45/20 |
| 2012/0286304 A1* | 11/2012 | LeToquin | H01L 33/505 |
| | | | 257/89 |
| 2013/0264937 A1* | 10/2013 | Sakuta | H01L 33/504 |
| | | | 313/503 |
| 2014/0340890 A1* | 11/2014 | Hata | A01G 7/045 |
| | | | 362/231 |
| 2016/0316527 A1* | 10/2016 | Allen | F21V 23/04 |
| 2016/0372638 A1* | 12/2016 | Todorov | H01L 33/504 |
| 2017/0054059 A1* | 2/2017 | Hosokawa | H01L 33/504 |
| 2017/0077360 A1* | 3/2017 | Yang | C09K 11/0883 |
| 2017/0250324 A1 | 8/2017 | Seki et al. | |
| 2018/0108816 A1 | 4/2018 | Todorov et al. | |
| 2019/0174587 A1* | 6/2019 | Petluri | A61N 5/0618 |
| 2019/0254142 A1* | 8/2019 | Petluri | H05B 33/0857 |

OTHER PUBLICATIONS

Pulli, Tomi, et al. "Advantages of White LED Lamps and New Detector Technology in Photometry." Light: Science & Applications, vol. 4, No. 9, 2015, doi:10.1038/lsa.2015.105 (Year: 2015).*

Table 23.2 of Fluorescence Excitations Sources, downloaded from URL<https://www.thermofisher.com/us/en/home/references/molecular-probes-the-handbook/tables/fluorescence-excitation-sources.html> on Mar. 9, 2020. (Year: 2022).*

Fu, Sheng, et al. "Effect of Al/Ga Substitution on the Structural and Luminescence Properties of Y3(Al1-XGax)5O12: Ce3+ Phosphors." Optical Materials, vol. 75, 2018, pp. 619-625., doi:10.1016/j.optmat.2017.11.021 (Year: 2017).*

Considerations for blending LED phosphors, Applications Note, Intermatix Corporation, Jan. 2013. (Year: 2013).*

What is CRI R9 and Why is it Important. downloaded from URL<https://www.waveformlighting.com/tech/what-is-cri-r9-and-why-is-it-important> on Jun. 21, 2020.*

"LED Tape Light Specifications" downloaded from URL <https://www.alloyled.com/skin/frontend/alloyled/default/downloads/primaline-3-led-tape-light-specification-sheet.pdf> on Jun. 21, 2020 (Year: 2020).*

International Search Report.
Written Opinion.

* cited by examiner

HIGH COLOR RENDERING WHITE LIGHT EMITTING DEVICES AND HIGH COLOR RENDERING PHOTOLUMINESCENCE COMPOSITIONS

FIELD OF THE INVENTION

Embodiments of the present invention are directed to light emitting devices comprising photoluminescence wavelength conversion materials. More particularly, although not exclusively, embodiments concern light emitting devices and photoluminescence compositions for generating white light with high color rendering properties including a general CRI Ra of greater than or equal to 90.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps. LED lamps (bulbs) are typically constructed from a small number of high-intensity white LEDs.

LEDs are known to include red photoluminescence materials or yellow to green photoluminescence materials or combinations thereof. However, depending on their composition and intrinsic properties, their performance can suffer particularly in terms of luminous efficacy (LE) and/or conversion efficiency (CE).

The invention arose in an endeavor to improve the quality of light generated by light emitting devices comprising photoluminescence compositions. A need, therefore, exists to improve characteristics such CRI Ra, CRI R9, CRI R8 and luminous efficacy in white light emitting devices and photoluminescence compositions therefor.

SUMMARY OF THE INVENTION

Embodiments of the invention concern high color rendering light emitting devices and photoluminescence compositions comprising a combination of a red photoluminescence material, a yellow to green photoluminescence material and a narrow-band red photoluminescence material. In this patent specification: a "narrow-band red photoluminescence material" refers to a material which, in response to stimulation by excitation light, generates light having a peak emission wavelength ($\lambda_{pe}$) in a range 625 nm to 635 nm; that is light in the red region of the visible spectrum and which has a full width at half maximum (FWHM) emission intensity of between about 5 nm and about 25 nm; a "red photoluminescence material" refers to a material which, in response to stimulation by excitation light, generates light having a peak emission wavelength ($\lambda_{pe}$) in a range 600 nm to 620 nm; that is light in the red region of the visible spectrum and which has a full width at half maximum (FWHM) emission intensity of greater than about 70 nm and less than 80 nm; and a "yellow to green photoluminescence material" refers to a material which, in response to stimulation by excitation light, generates light having a peak emission wavelength ($\lambda_{pe}$) in a range 530 nm to 550 nm; that is light in the yellow to green region of the visible spectrum. The narrow-band red photoluminescence materials can comprise a narrow-band red phosphor and/or a red quantum dot (QD) material, for example a cadmium-containing (Cd-containing) QD.

According to an aspect of the invention, there is provided a light emitting device comprising: an excitation source operable to generate excitation light with a dominant wavelength in a range 450 nm to 470 nm; a red photoluminescence material which generates light with a peak emission wavelength in a range 600 nm to 620 nm with a full width at half maximum emission intensity greater than 70 nm and less than 80 nm; a yellow to green photoluminescence material which generates light with a peak emission wavelength in a range 530 nm to 550 nm; and a narrow-band red photoluminescence material which generates light with a peak emission wavelength in a range 625 nm to 635 nm with a full width at half maximum emission intensity greater than about 5 nm and less than about 25 nm.

In this way, devices formed in accordance with the invention can be configured to produce white light that meets current standards for CRI Ra, CRI R8 and CRI R9 and have a conversion efficiency (CE) and luminous efficacy (LE) that are superior than those of known devices. More particularly, devices according to the invention comprising a red, a yellow to green, and a narrow-band red photoluminescence material can produce white light that meets the current standards of CRI Ra of about 90, a CRI R8 of about 72 and a CRI R9 of about 50 and have a conversion efficiency/luminous efficacy (for example 330 lm/W to 350+ lm/W) depending on color temperature) that are superior to known devices.

In some embodiments, the red photoluminescence material, the yellow to green photoluminescence material and the narrow-band red photoluminescence material comprise a mixture in for example a single layer. In other embodiments, the photoluminescence materials can be provided in separate locations such as, for example, in separate respective regions (e.g. layers) of a single component or in separate components. For light emitting devices, the photoluminescence materials can be provided in the form of an encapsulating layer on the one or more solid-state light emitters (e.g. LEDs). Alternatively, the light emitting device can comprise a remote phosphor configuration in which the photoluminescence materials are provided in a separate component that is located remotely (in spaced separation) to the excitation sources and may be separated by an air gap or other medium.

In embodiments, the light emitting device may be operable to generate white light with a color temperature of 2700 K to 5000 K, a CRI Ra of greater than or equal to 90, a CRI R9 of greater than or equal to 50, a CRI R8 of greater than or equal to 72 and a luminous efficacy selected from the group consisting of: greater than or equal to about 330 lm/W$_{opt}$, greater than or equal to about 340 lm/W$_{opt}$, and greater than or equal to about 350 lm/W$_{opt}$.

The light emitting device may be characterized by generating white light spectrum having a first broad emission peak from about 580 nm to about 587 nm (optionally at about 585 nm) and a second narrow emission peak at about 632 nm, wherein the ratio of the peak emission intensity of the first peak to the peak emission intensity of the second peak is in a range 20% to 30%, optionally 25%.

The red photoluminescence material may generate light with a peak emission wavelength selected from the group consisting of being in a range 610 nm to 620 nm and being about 615 nm.

It may be that the red photoluminescence material has a full width at half maximum emission intensity selected from the group consisting of: greater than or equal to 73 nm and less than or equal to 78 nm, and about 75 nm.

The red photoluminescence material may be selected from the group consisting of: a calcium aluminum silicon nitride based phosphor having a general composition $CaAlSiN_3$:Eu, a nitride-based phosphor having a general composition $Ba_{2-x}Sr_xSi_5N_8$:Eu, and a silicate-based phosphor having a general composition $(Sr,Ba,Y)_3(Si,Al)O_5$:Eu.

The red photoluminescence material may comprise a calcium aluminum silicon nitride based phosphor having a general composition $CaAlSiN_3$:Eu having a peak emission wavelength of about 615 nm and a full width at half maximum emission intensity greater than or equal to 73 nm and less than or equal to 78 nm, optionally about 75 nm.

The narrow-band red photoluminescence material may generate light with a peak emission wavelength in a range selected from the group consisting of: 630 nm to 635 nm and 630 nm to 632 nm.

In embodiments, the narrow-band red photoluminescence material may be a manganese-activated fluoride phosphor selected from the group consisting of: $K_2SiF_6$:$Mn^{4+}$, $K_2GeF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, and $Rb_2TiF_6$:$Mn^{4+}$.

The yellow to green photoluminescence material may generate light with a peak emission wavelength selected from the group consisting of: in a range 530 nm to 540 nm, about 535 nm, in a range 540 nm to 545 nm, and about 543 nm.

It may be that the concentration of red photoluminescence material in the total amount of red photoluminescence material and narrow-band red photoluminescence material is in a range from 1 wt % to 10 wt %, optionally with a concentration of 3 wt %.

The yellow to green photoluminescence material may be selected from the group consisting of: a cerium-activated garnet phosphor of general composition $(Y,Lu)_3(Al,Ga)_5O_{12}$:Ce, a cerium-activated garnet phosphor of general composition $Y_3(Al,Ga)_5O_{12}$:Ce, and an aluminate phosphor of general composition $Lu_3Al_5O_{12}$:Ce.

In embodiments, it may be that the red photoluminescence material comprises a calcium aluminum silicon nitride based phosphor of general composition $CaAlSiN_3$:Eu and generates light with a peak emission wavelength of about 615 nm and has a full width at half maximum emission intensity greater than or equal to 73 nm and less than or equal to 78 nm; the yellow to green photoluminescence material comprises a cerium-activated garnet phosphor of general composition $Y_3(Al,Ga)_5O_{12}$:Ce and generates light with a peak emission wavelength of about 543 nm; and the narrow-band red photoluminescence material comprises a manganese-activated potassium hexafluorosilicate phosphor of composition $K_2SiF_6$:$Mn^{4+}$ and generates light with a peak emission wavelength in a range 630 nm to 632 nm.

According to another aspect, the present invention contemplates a light emitting device comprising: an excitation source operable to generate excitation light with a dominant wavelength in a range 450 nm to 470 nm; a manganese doped fluoride photoluminescence material which generates light with a peak emission wavelength of about 632 nm, wherein said light emitting device is operable to generate white light with a color temperature of 2700 K to 5000 K, a CRI Ra of greater than or equal to 90, a CRI R9 ranging from 50 to 70, and a luminous efficacy ranging from selected from the 3401 m/$W_{opt}$ to about 355 lm/$W_{opt}$.

It may be that the manganese-activated fluoride photoluminescence material is selected from the group consisting of: $K_2SiF_6$:$Mn^{4+}$, $K_2GeF_6$:$Mn^{4+}$, and $K_2TiF_6$:$Mn^{4+}$. The light emitting device may further comprise a red photoluminescence material which generates light with a peak emission wavelength in a range 600 nm to 620 nm with a full width at half maximum emission intensity greater than 70 nm and less than 80 nm.

According to another aspect, the invention comprehends a light emitting device comprising: an excitation source operable to generate excitation light with a dominant wavelength in a range 450 nm to 470 nm; a manganese doped fluoride photoluminescence material which generates light with a peak emission wavelength of about 632 nm, a red photoluminescence material which generates light with a peak emission wavelength in a range 600 nm to 620 nm with a full width at half maximum emission intensity greater than 70 nm and less than 80 nm, wherein said light emitting device characterized by generating white light spectrum having a first broad emission peak from about 580 nm to about 587 nm (optionally at about 585 nm) and a second narrow emission peak at about 632 nm, wherein the ratio of the peak emission intensity of the first peak to the peak emission intensity of the second peak is in a range 20% to 30%, optionally 25%.

The light emitting device may comprise a red photoluminescence material which generates light with a peak emission wavelength at about 615 nm with a full width at half maximum emission intensity greater than 70 nm and less than 80 nm; and manganese-activated fluoride photoluminescence material is selected from the group consisting of: $K_2SiF_6$:$Mn^{4+}$, $K_2GeF_6$:$Mn^{4+}$, and $K_2TiF_6$:$Mn^{4+}$.

According to an aspect of the invention, there is contemplated a high color rendering photoluminescence composition comprising: a red photoluminescence material which generates light with a peak emission wavelength in a range 600 nm to 620 nm with a full width at half maximum emission intensity greater than 70 nm and less than 80 nm; a yellow to green photoluminescence material which generates light with a peak emission wavelength in a range 530 nm to 550 nm; and a narrow-band red photoluminescence material which generates light with a peak emission wavelength in a range 625 nm to 635 nm with a maximum full width at half maximum emission intensity of about 25 nm.

In embodiments, the red photoluminescence material may comprise a calcium aluminum silicon nitride based phosphor of general composition $CaAlSiN_3$:Eu that generates light with a peak emission wavelength of about 615 nm and has a full width at half maximum emission intensity greater than or equal to 73 nm and less than or equal to 78 nm and the narrow-band red photoluminescence material comprises a manganese-activated fluoride photoluminescence material is selected from the group consisting of: $K_2SiF_6$:$Mn^{4+}$, $K_2GeF_6$:$Mn^{4+}$, and $K_2TiF_6$:$Mn^{4+}$.

In accordance with the invention, there is also provided a photoluminescence composition comprising a combination of a red photoluminescence material, a yellow to green photoluminescence material and a narrow-band red photoluminescence material enables high color rendering light emitting devices to be implemented that produce white light meeting current lighting standards namely: CRI Ra≥90 (Energy Star), CRI R8 minimum 72 (California Energy Commission Title 20 code) and CRI R9 minimum 50 (CEC Title 24 code). Moreover, the light emitting devices in accordance with the invention also exhibit a higher conversion efficiency and luminous efficacy compared with current light emitting devices.

In accordance with an embodiment of the invention, there is envisaged a high color rendering photoluminescence composition comprising: a red photoluminescence material which generates light with a peak emission wavelength in a range 600 nm to 620 nm with a full width at half maximum emission intensity of greater than about 70 nm and less than 80 nm; a yellow to green photoluminescence material which generates light with a peak emission wavelength in a range 530 nm to 550 nm; and a narrow-band red photoluminescence material which generates light with a peak emission wavelength in a range 625 nm to 635 nm with a maximum full width at half maximum emission intensity of about 25 nm.

In some embodiments, the red photoluminescence material generates light with a peak emission wavelength in a range 610 nm to 615 nm, more preferably about 615 nm. The red photoluminescence material can comprise a calcium aluminum silicon nitride (CASN) based phosphor having a general composition $CaAlSiN_3$:Eu and a full width at half maximum emission intensity that is greater than or equal to 73 nm and less or equal to 78 nm.

In some embodiments, the narrow-band red photoluminescence material generates light with a peak emission wavelength in a range 630 nm to 635 nm. The narrow-band red photoluminescence material can comprise a phosphor or Quantum Dot (QD) material or a combination thereof. In some embodiments, the narrow-band red photoluminescence material is a manganese-activated fluoride phosphor and can comprise for example a manganese-activated potassium hexafluorosilicate phosphor of composition $K_2SiF_6$:$Mn^{4+}$. Such a phosphor has a peak emission wavelength in a range 630 nm to 632 nm. Alternatively, the manganese-activated fluoride phosphor can have a composition selected from the group consisting of: $K_2GeF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, and $Rb_2TiF_6$:$Mn^{4+}$.

In embodiments where it is intended to generate light with a color temperature in a range 4000 K to 5000 K, that is cool white, the yellow to green photoluminescence material can generate light with a peak emission wavelength in a range 530 nm to 540 nm and in some embodiments generate light with a peak emission wavelength of about 535 nm. The yellow to green photoluminescence material can comprise a cerium-activated garnet phosphor of general composition $(Y,Ba)_3(Al,Ga)_5O_{12}$:Ce. Alternatively, the yellow to green photoluminescence material can comprise an aluminate phosphor of general composition $Lu_3Al_5O_{12}$:Ce.

In embodiments where it is intended to generate light with a color temperature in a range 2700 K to 3000 K, that is warm white, the yellow to green photoluminescence material can generate light with a peak emission wavelength in a range 540 nm to 545 nm and in some embodiments generate light with a peak emission wavelength of about 543 nm. The yellow to green photoluminescence material can comprise a cerium-activated garnet phosphor of general composition $Y_3(Al,Ga)_5O_{12}$:Ce. Alternatively, the yellow to green photoluminescence material can comprise an aluminate phosphor of general composition $Lu_3Al_5O_{12}$:Ce.

According to any embodiment, a light emitting device comprises an excitation source operable to generate excitation light with a dominant wavelength in a range 450 nm to 470 nm and the photoluminescence composition of the preceding paragraphs. Light emitting devices in accordance with embodiments of the invention can be configured to generate white light with a color temperature in a range about 2700 K to about 5000K. In embodiments, the light emitting device is further characterized by generating white light with at least one of a CRI Ra of greater than or equal to 90, a CRI R9 of greater than or equal to 50, and a CRI R8 of greater than or equal to 72. The light emitting device can be further characterized by a luminous efficacy (LE) of greater than or equal to about 330 $lm/W_{opt}$, optionally an LE of greater than or equal to about 340 $lm/W_{opt}$ and optionally an LE of greater than or equal to about 350 $lm/W_{opt}$.

According to an embodiment of the invention, there is contemplated a light emitting device comprising: an excitation source operable to generate excitation light with a dominant wavelength in a range 450 nm to 470 nm; a red photoluminescence material which generates light with a peak emission wavelength in a range 600 nm to 620 nm with a full width at half maximum emission intensity greater than 70 nm and less than 80 nm; a yellow to green photoluminescence material which generates light with a peak emission wavelength in a range 530 nm to 550 nm; and a narrow-band red photoluminescence material which generates light with a peak emission wavelength in a range 625 nm to 635 nm with a maximum full width at half maximum emission intensity of about 25 nm; wherein said light emitting device is operable to generate white light with a color temperature of 2700 K to 5000K, a CRI Ra of greater than or equal to 90, a CRI R9 of greater than or equal to 50, a CRI R8 of greater than or equal to 72, and a luminous efficacy of greater than or equal to about 340 $lm/W_{opt}$.

In some embodiments, the red photoluminescence material can comprise a calcium aluminum silicon nitride based phosphor of general composition $CaAlSiN_3$:Eu that generates light with a peak emission wavelength of about 615 nm and a full width half maximum emission intensity greater than or equal to 73 nm and less than or equal to 78 nm; the yellow to green photoluminescence material can comprise a cerium-activated garnet phosphor of general composition $Y_3(Al,Ga)_5O_{12}$:Ce that generates light with a peak emission wavelength of about 543 nm; and the narrow-band red photoluminescence material can comprise a manganese-activated potassium hexafluorosilicate phosphor of composition $K_2SiF_6$:$Mn^{4+}$ that generates light with a peak emission wavelength in a range 630 nm to 632 nm. Such light emitting devices find particular utility for generating white light with a color temperature of between about 2700 K and about 3000 K, that is warm white.

In other embodiments, the red photoluminescence material can comprise a calcium aluminum silicon nitride based phosphor of general composition $CaAlSiN_3$:Eu that generates light with a peak emission wavelength of about 615 nm and a full width half maximum emission intensity greater than or equal to 73 nm and less than or equal to 78 nm; the yellow to green photoluminescence material can comprise a cerium-activated garnet phosphor of general composition $(Y,Ba)_3(Al,Ga)_5O_{12}$:Ce that generates light with a peak emission wavelength of about 535 nm; and the narrow-band red photoluminescence material comprises a manganese-activated potassium hexafluorosilicate phosphor of composition $K_2SiF_6$:$Mn^{4+}$ and generates light with a peak emission wavelength in a range 630 nm to 632 nm. Such light emitting devices find particular utility for generating white light with a color temperature of between about 4000 K and about 5000 K, that is cool white.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the invention concern high color rendering light emitting devices and photoluminescence compositions comprising a combination (typically a mixture) of a red photoluminescence material, a yellow to green photoluminescence material and a narrow-band red photoluminescence material. As defined above, in this patent specification a "narrow-band red photoluminescence" material refers to a material which generates light having a peak emission wavelength ($\lambda_{pe}$) in a range 625 nm to 635 nm, that is in the orange to red region of the visible spectrum and a FWHM of between about 5 nm and about 25 nm; a "red photoluminescence material" refers to a material which, in response to stimulation by excitation light, generates light having a peak emission wavelength in a range 600 nm to 620 nm; that is light in the red region of the visible spectrum and which has a full width at half maximum (FWHM) emission intensity of greater than about 70 nm and less than 80 nm; and a "yellow to green photoluminescence material" refers to a material which, in response to stimulation by excitation light, generates light having a peak emission wavelength in a range 530 nm to 550 nm; that is light in the yellow to green region of the visible spectrum.

Figure 1:
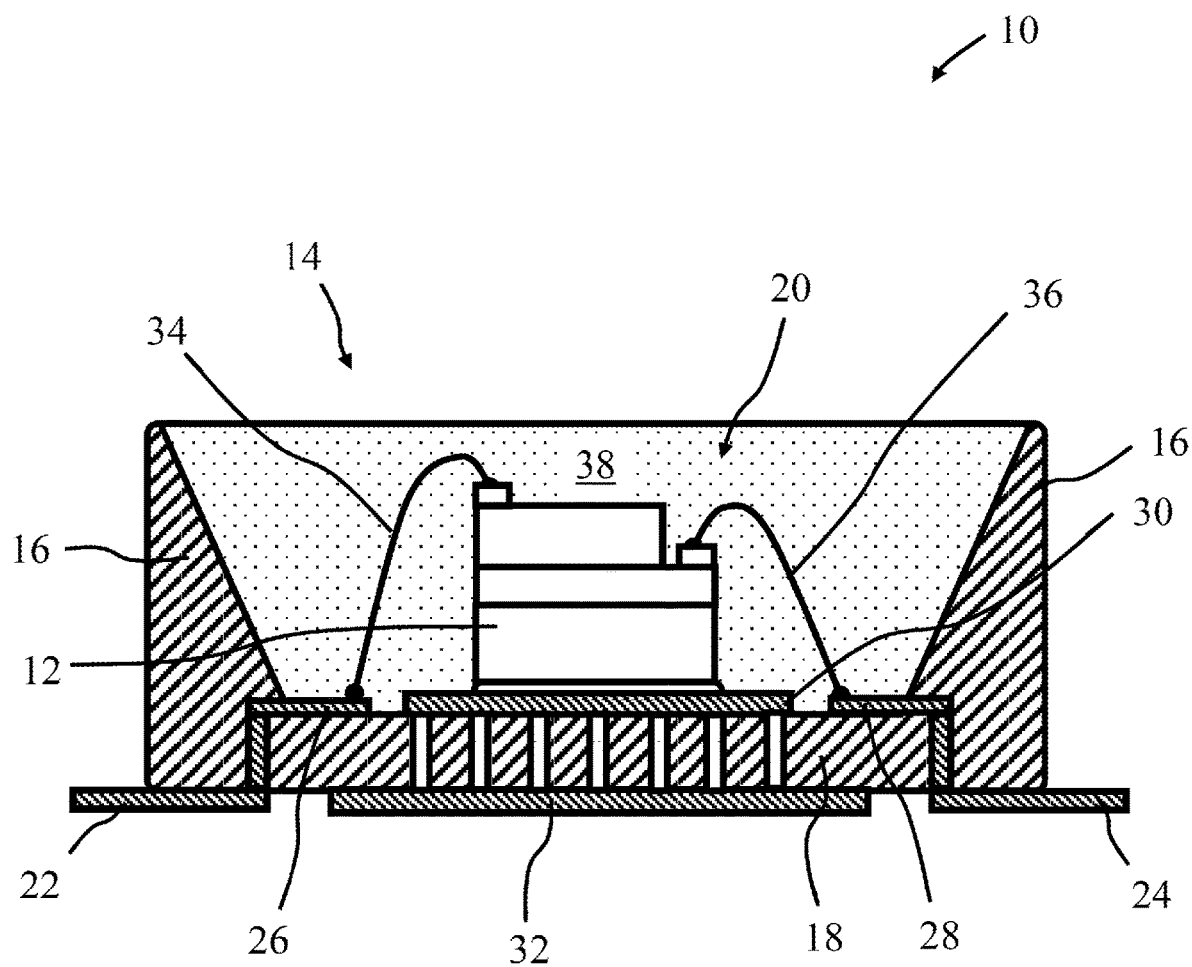
FIG. 1 is schematic representation of an LED-based white light emitting device in accordance with an embodiment of the invention.

FIG. 1 is a schematic representation of a white light emitting device 10, according to an embodiment of the invention. The device 10 is configured to generate warm white light with a CCT (Correlated Color Temperature) of in a range 2700 K to 5000 K and a General CRI (Color Rendering Index) CRI (Ra) of 90 and higher.

The device 10 can comprise one or more blue-emitting GaN (gallium nitride)-based LED chips 12 that are housed within a package 14. The one or more LED chips are operable to generate blue light with a dominant wavelength within a range of 440 nm to 470 nm, typically 450 nm to 470 nm. The package, which can for example comprise Surface Mountable Device (SMD) such as an SMD 2835 LED package, comprises upper and lower body parts 16, 18 respectively. The upper body part 16 defines a recess 20 which is configured to receive the one or more LED chips 12. The package further comprises electrical connectors 22 and 24 on the base that are electrically connected to corresponding electrode contact pads 26 and 28 on the floor of the recess 20. Using adhesive or solder, the LED chip(s) 12 can be mounted to a thermally conductive pad 30 located on the floor of the recess 20. The thermally conductive pad 30 is thermally connected to a thermally conductive pad 32 on the base of the package. The LED chip's electrode pads are electrically connected to corresponding electrode contact pads 26 and 28 on the floor of the package using bond wires 34 and 36 and the recess 20 is completely filled with a light transmissive optical encapsulant 38, typically an optically clear silicone, which is loaded with a mixture of photoluminescence materials such that the exposed surfaces of the LED chip 12 are covered by the photoluminescence/silicone material mixture. In accordance with embodiments of the invention, the photoluminescence materials comprise i) a red photoluminescence material, ii) a yellow to green photoluminescence material and iii) a narrow-band red photoluminescence material. To enhance the emission brightness of the device, the walls of the recess 20 are inclined and have a light reflective surface.

Red Photoluminescence Materials

The red photoluminescence material can comprise any red photoluminescence material, typically a phosphor in particulate form, that is excitable by blue light and operable to emit light with a peak emission wavelength ($\lambda_{pe}$) in a range about 600 nm to about 620 nm and which has a full width at half maximum (FWHM) emission intensity of greater than about 70 nm and less than 80 nm and may include for example a europium activated silicon nitride-based phosphor, α-SiAlON or a silicate phosphor. Examples of such red phosphors are given in Table 1.

Figure 2:
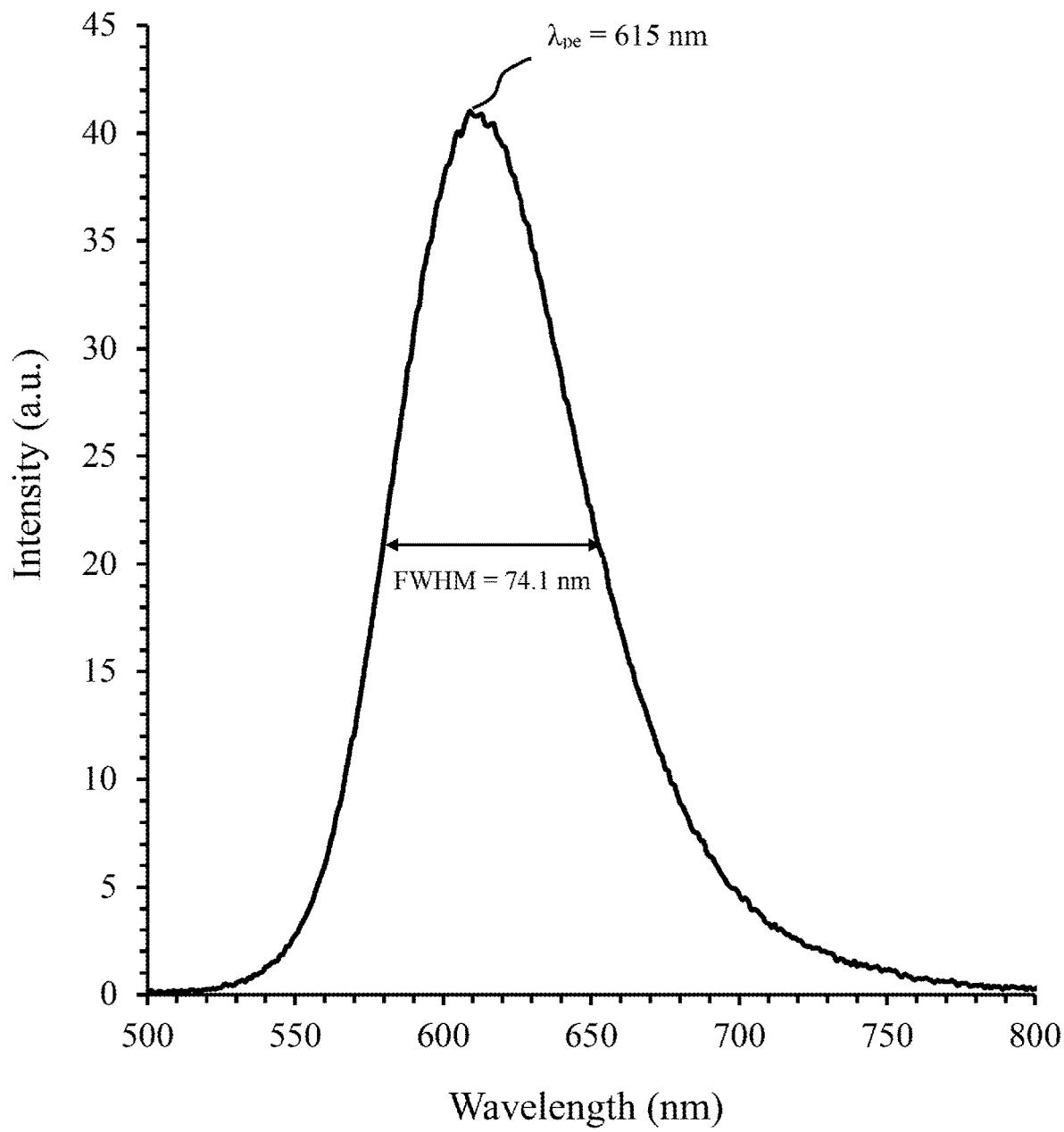
FIG. 2 shows an emission spectra of CASN615 phosphor $(Sr,Ca)AlSiN_3:Eu^{2+}$—peak emission wavelength $\lambda_{pe}$=615 nm and full width at half maximum (FWHM) emission intensity in a range 74 nm to 75 nm)

In some embodiments, the europium activated silicon nitride-based red phosphor red phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. The CASN phosphor has a peak emission wavelength ($\lambda_{pe}$) in a range about 600 nm to about 620 nm and has a full width at half maximum emission intensity of greater than 70 nm and less than 80 nm, more typically greater than or equal to 73 nm and less than or equal to 78 nm. In this patent specification, the notation CASN # represents the phosphor type (CASN) followed by the peak emission wavelength ($\lambda_{pe}$) in nanometers (#). For example, CASN615 denotes a red CASN phosphor with a peak emission wavelength of 615 nm. FIG. 2 shows an emission spectra CASN615 phosphor. CASN615 has a peak emission wavelength of 615 nm with a FWHM of approximately 74.1 nm, that is less than 80 nm. CASN phosphor with a peak emission wavelength in a range 610 nm to 620 nm have a FWHM in a range greater than or equal to 73 nm and less than or equal to 78 nm.

In one embodiment, the red phosphor can comprise a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \le a \le 0.4$; $1.5 < b < 2.5$; $4.0 \le c \le 5.0$; $0.1 \le d \le 0.15$; $7.5 < e < 8.5$; and $0 < f < 0.1$; wherein $a+b+f > 2+d/v$ and v is the valence of M.

Alternatively, the red phosphor comprises a red light emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \le x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites. Examples of such red nitride phosphors are the XR series of phosphors from Intematix Corporation, Fremont Calif., USA, for example XR610 which has a peak emission wavelength of 610 nm and a FWHM of about 79 nm.

ganic or silicate phosphor materials. In some embodiments, the yellow to green photoluminescence materials comprises a cerium-activated yttrium aluminum garnet phosphor of general composition $Y_3(Al,Ga)_5O_{12}$:Ce (YAG) such as for example a YAG series phosphor from Intematix Corporation, Fremont Calif., USA which have a peak emission wavelength of in a range 527 nm to 543 nm and a FWHM of ~120 nm. In this patent specification, the notation YAG # represents the phosphor type-YAG-based phosphors—followed by the peak emission wavelength in nanometers (#). For example, YAG535 denotes a YAG phosphor with a peak emission wavelength of 535 nm. The yellow to green photoluminescence material may comprise a cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont Calif., USA. In some embodiments, the green photoluminescence material can comprise an aluminate phosphor of general composition $Lu_3Al_5O_{12}$:Ce (GAL). Examples of such phosphors include for example the GAL series of phosphor from Intematix Corporation, Fremont Calif., USA which have a peak emission wavelength of 516 nm to 560 nm and a FWHM of ~120 nm. In this patent specification, the notation GAL # represents the phosphor type (GAL)-LuAG-based phosphors—followed by the peak

TABLE 1

Example red photoluminescence materials

| Phosphor | General Composition | | Wavelength $\lambda_{pe}$ (nm) | FWHM (nm) |
|---|---|---|---|---|
| CASN | $(Ca_{1-x}Sr_x)AlSiN_3$:Eu | $0.5 < x \le 1$ | 600-620 | 73-78 |
| 258 nitride | $Ba_{2-x}Sr_xSi_5N_8$:Eu | $0 \le x \le 2$ | 580-620 | 79 |
| Silicate | $(Sr,Ba,Y)_3(Si,Al)O_5$:Eu | | 600-620 | 79 |

Yellow to Green Photoluminescence Materials

In this patent specification, a yellow to green photoluminescence material refers to a material which generates light having a peak emission wavelength ($\lambda_{pe}$) in a range ~530 nm to ~550 nm, that is in the yellow to green region of the visible spectrum. Preferably, the yellow to green photoluminescence material has a broad emission characteristic and preferably has a FWHM of ~100 nm or wider. The yellow to green photoluminescence material can comprise any photoluminescence material, such as for garnet-based inoremission wavelength in nanometers (#). For example, GAL535 denotes a GAL phosphor with a peak emission wavelength of 535 nm.

Examples of silicate phosphors include europium activated ortho-silicate phosphors of general composition $(Ba,Sr)_2SiO_4$:Eu such as for example G, EG, Y and EY series of phosphors from Intematix Corporation, Fremont Calif., USA which have a peak emission wavelength in a range 507 nm to 570 nm and a FWHM of ~70 nm to ~80 nm. Examples of suitable yellow to green phosphors are given in Table 2.

TABLE 2

Example yellow to green photoluminescence materials

| Phosphor | General Composition | | Wavelength $\lambda_{pe}$ (nm) | FWHM (nm) |
|---|---|---|---|---|
| YAG | $Y_{3-x}(Al_{1-y}Ga_y)_5O_{12}$:Ce$_x$ | $0.01 < x < 0.2$ & $0 < y < 2.5$ | 520-550 | ≥100 |
| GNYAG | $(Y,Ba)_{3-x}(Al_{1-y}Ga_y)_5O_{12}$:Ce$_x$ | $0.01 < x < 0.2$ & $0 < y < 2.5$ | 520-550 | ≥100 |
| LuAG | $Lu_{3-x}(Al_{1-y}M_y)_5O_{12}$:Ce$_x$ | $0.01 < x < 0.2$ & $0 < y < 1.5$ M = Mg, Ca, Sr, Ba, Ga, | 500-550 | ≈120 |
| LuAG | $Lu_{3-x}(Al_{1-y}Ga_y)_5O_{12}$:Ce$_x$ | $0.01 < x < 0.2$ & $0 < y < 1.5$ | 500-550 | ≈120 |
| Silicate | $A_2SiO_4$:Eu | A = Mg, Ca, Sr, Ba | 500-550 | 70-80 |
| Silicate | $(Sr_{1-x}Ba_x)_2SiO_4$:Eu | $0.3 < x < 0.9$ | 500-550 | 70-80 |

Narrow-Band Red Photoluminescence Materials

The narrow-band red photoluminescence materials can comprise a narrow-band red phosphor and/or a red quantum dot (QD) material which, in response to stimulation by excitation light, generates light having a peak emission wavelength in a range 625 nm to 635 nm; that is light in the red region of the visible spectrum and which has a maximum full width at half maximum (FWHM) emission intensity of about 20 nm, more particularly in a range of between about 4 nm and about 20 nm.

Narrow-Band Red Phosphors: Manganese-Activated Fluoride Phosphors

Figure 3:
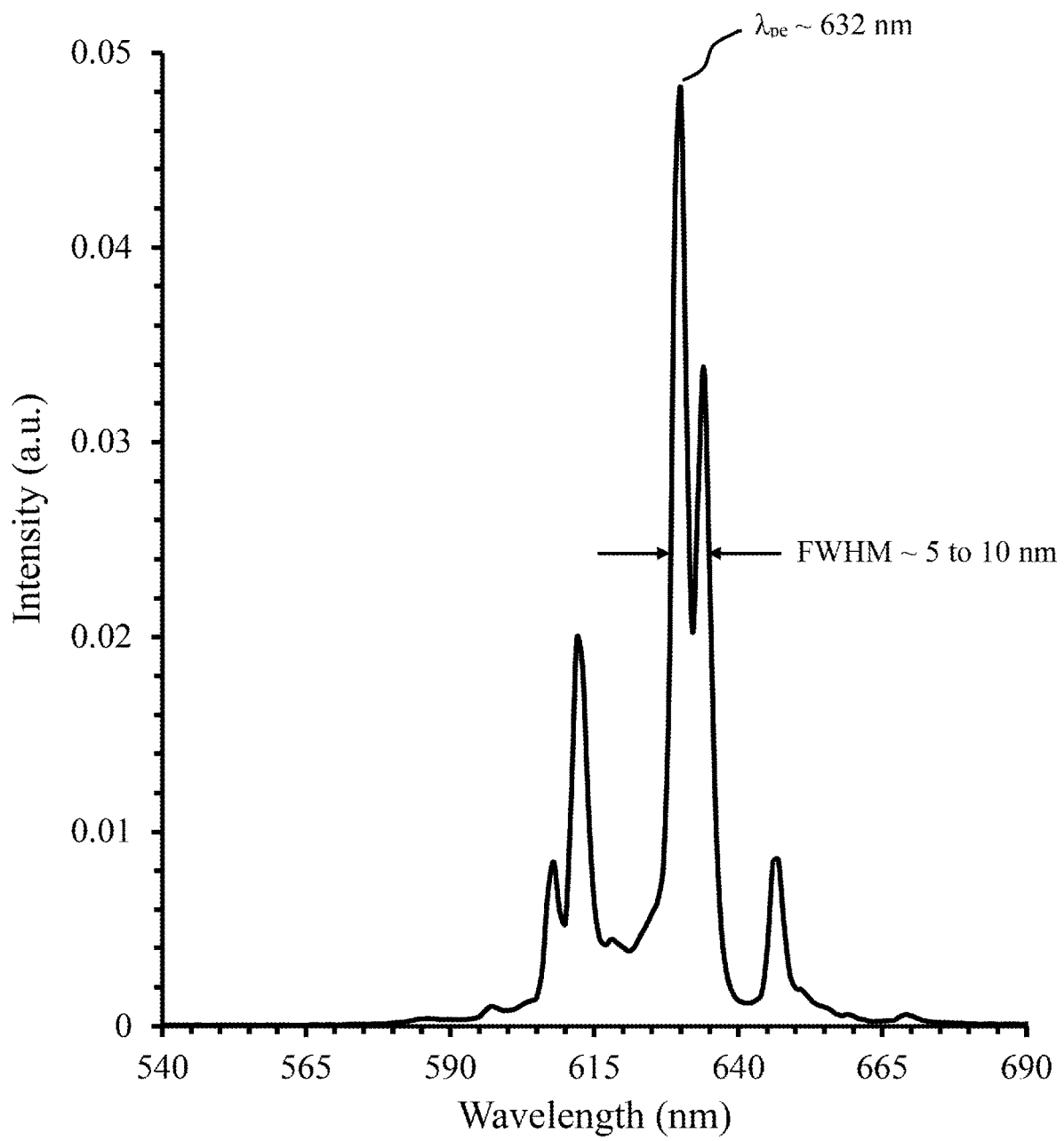
FIG. 3 shows an emission spectrum for KSF ($K_2SiF_6$: $Mn^{4+}$) narrow-band red phosphor.

Narrow-band red phosphors can include manganese-activated fluoride phosphors (i.e. $Mn^{4+}$ doped). An example of a manganese-activated fluoride phosphor is manganese-activated potassium hexafluorosilicate phosphor (KSF)—$K_2SiF_6:Mn^{4+}$. An example of such a phosphor is NR6931 KSF phosphor from Intematix Corporation, Fremont Calif., USA which has a peak emission wavelength of about 632 nm. FIG. 3 shows the emission spectrum of NR6931 KSF phosphor. KSF phosphor is excitable by blue excitation light and generates red light with a peak emission wavelength ($\lambda_{pe}$) of between about 631 nm and about 632 nm with a FWHM of ~4.7 nm to ~10 nm (depending on the way it is measured: i.e. whether the width takes account of a single or double peaks—FIG. 3). Other manganese-activated phosphors can include: $K_2GeF_6:Mn^{4+}$, $K_2TiF_6:Mn^{4+}$, $K_2SnF_6:Mn^{4+}$, $Na_2TiF_6:Mn^{4+}$, $Na_2ZrF_6:Mn^{4+}$, $Cs_2SiF_6:Mn^{4+}$, $Cs_2TiF_6:Mn^{4+}$, $Rb_2SiF_6:Mn^{4+}$, and $Rb_2TiF_6:Mn^{4+}$.

Narrow-Band Red Photoluminescence Materials: Red Quantum Dots (QDs)

A quantum dot (QD) is a portion of matter (e.g. semiconductor) whose excitons are confined in all three spatial dimensions that may be excited by radiation energy to emit light of a particular wavelength or range of wavelengths. The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). Narrow-band red QDs generate light with a FWHM emission intensity in a range 4 nm to about 25 nm.

The QD materials can comprise core/shell nano-crystals containing different materials in an onion-like structure. For example, the above-described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium.

Narrow-band red QDs can comprise different materials and typically comprise cadmium-based QDs in order to achieve a FWHM emission intensity in a range 5 nm to about 20 nm. In the case of cadmiun-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Examples of Cd containing narrow-band red QDs are given in Table 3.

TABLE 3

| Narrow-band Red QD composition | |
|---|---|
| CdSe ~4.2 nm | cadmium selenide |
| $Cd_xZn_{1-x}Se$ | cadmium zinc selenide |
| CdZnSeS | cadmium zinc selenium sulfide |
| $CdSe_xS_{1-x}$ | cadmium selenium sulfide |
| CdTe | cadmium telluride |
| $CdTe_xS_{1-x}$ | cadmium tellurium sulfide |

Cavity Test

The cavity test method involves mixing the phosphor powder mixture with an uncurable optical encapsulant (typically a silicone) and placing the mixture in a LED cavity containing one or more blue LED dies and measuring total light emission in an integrating sphere. Once the measurement is completed the phosphor/encapsulant mixture is removed and the cavity cleaned ready for the next test.

In this specification, the following nomenclature is used to denote light emitting devices: Com. # denotes a comparative light emitting device comprising one or more yellow to green phosphors and one of a red nitride phosphor (CASN) or a narrow-band red photoluminescence material and Dev. # denotes a light emitting device in accordance with an embodiment of the invention comprising a red photoluminescence material, a yellow to green photoluminescence material and a narrow-band red photoluminescence material.

2700 K to 3000 K Light Emitting Devices

Table 4 tabulates phosphor compositions for nominal 2700K light emitting devices for a comparative device (2700K, CRI Ra 90), denoted Com.1, comprising a mixture of YAG545/YAG563 and KSF and a light emitting device in accordance with the invention, denoted Dev.1, comprising a mixture of YAG543, CASN615 and KSF.

As can be seen from Table 4, in terms of phosphor composition: Com.1 comprises 14.7 wt % YAG545/YAG563+85.3 wt % KSF ($K_2SiF_6:Mn^{4+}$) and Dev.1 comprises 2.1 wt % CASN615 ($Ca_{1-x}Sr_xAlSiN_3:Eu$, $\lambda_{pe}$=615 nm, FWHM≈74 to 75 nm)+28.1 wt % YAG543 ($\lambda_{pe}$=543 nm)+69.8 wt % KSF. In Dev.1 the wt % of red phosphor (CASN) out of the total red phosphor content (CASN+KSF) is 2.9 wt %. Each of Com.1 and Dev.1 comprise a PCT2835 (2.8 mm by 3.5 mm) cavity containing three 1133 (0.011" by 0.033") LED dies with a dominant wavelength ($\lambda_d$) of 455 to 460 nm.

TABLE 4

| | 2700K light emitting device phosphor composition | | | | | | | |
|---|---|---|---|---|---|---|---|---|
| | Phosphor composition (wt. %) | | | | | | | Total |
| | Red phosphor | Yellow to Green phosphor | | | Narrow-band red phosphor | wt % CASN of total | wt % KSF of total | phosphor per 100 g |
| Device | CASN615 | YAG543 | YAG545 | YAG563 | KSF | red phosphor | red phosphor | silicone (g) |
| Com. 1 | — | — | 10.3 | 4.4 | 85.3 | 0.0 | 100.0 | 120.4 |
| Dev. 1 | 2.1 | 28.1 | — | — | 69.8 | 2.9 | 97.1 | 122.3 |

Table 5 tabulates measured phosphor PCT2835 cavity test data for light emitting devices Com.1 and Dev. 1 under test (drive) conditions $I_F$=100 mA, $V_F$≈9.0V (900 mW) and illustrates the effect on optical performance of using a combination of a red phosphor (CASN) and narrow-band red phosphor (KSF) compared with using a narrow-band red phosphor (KSF) alone. First, it is to be noted that the device (Dev.1) in accordance with the invention comprising a combination of a red phosphor (CASN615) and a narrow-band red phosphor (KSF), exhibits a 6.1% increase in Conversion Efficiency (CE) (129.2 lm/W→134.2 lm/W) and a 2.4% increase in Luminous Efficacy (LE) (343.6 lm/W$_{opt}$→351.8 lm/W$_{opt}$) compared with the comparative device (Com.1) that in terms of red photoluminescence material comprises a narrow-band red phosphor (KSF) alone. Second, in terms of color rendering, device Dev.1 produces white light with a CRI Ra of 90, a CRI R8 of 83 and a CRI R9 of 55 closely meeting the current standards in lighting, Energy Star (CRI Ra≥90), California Energy Commission Title 20 code (72 minimum CRI R8) and California Energy Commission Title 24 code (50 minimum CRI R9) with a luminous efficacy of greater than 3501 m/W. In contrast, the comparative device Com.1 produces white light with a CRI Ra of 90, a CRI R8 of 94.5 and a CRI R9 of 86 with a luminous efficacy of about 3401 m/W. While the device Com.1 generates white light with higher CRI R8 and R9 values, these are unnecessarily high compared with the standards and come at the expense of conversion efficiency/luminous efficacy. In contrast it will be appreciated that the device in accordance with the invention not only produces light meeting current standards but also exhibits a significant increase in conversion efficiency/luminous efficacy.

TABLE 5

| | 2700K light emitting device - Measured test data for PCT2835 cavity test | | | | | | | | | CRI | |
|---|---|---|---|---|---|---|---|---|---|---|---|
| | Flux | CE | CE | LE | LE | | | CCT | | | |
| Device | (lm) | (lm/W) | (%) | (lm/W$_{opt}$) | (%) | CIE x | CIE y | (K) | Ra | R8 | R9 |
| Com. 1 | 116.8 | 129.2 | 100.0 | 343.6 | 100.0 | 0.4512 | 0.4196 | 2996 | 89.8 | 94.5 | 86.0 |
| Dev. 1 | 124.0 | 134.2 | 106.1 | 351.8 | 102.4 | 0.4528 | 0.4232 | 2900 | 90.3 | 83.1 | 54.5 |

Table 6 tabulates phosphor compositions for nominal 2700K light emitting devices for light emitting device in accordance with the invention, denoted Dev.2 to Dev.4, comprising a mixture of YAG543, CASN615 and KSF with different relative proportions of KSF to CASN615.

More particularly, as can be seen from Table 6, in terms of phosphor composition: Dev.2 comprises 1.5 wt % CASN615+23.9 wt % YAG543+74.6 wt % KSF; Dev.3 comprises 2.1 wt % CASN615+28.2 wt % YAG543+69.7 wt % KSF; and Dev.4 comprises 3.1 wt % CASN615+34.4 wt % YAG543+62.5 wt % KSF. Each of Dev.2 to Dev.4 comprises a PCT2835 (2.8 mm by 3.5 mm) cavity containing three 1133 (0.011" by 0.033") LED dies with a dominant wavelength ($\lambda_d$) of 455 nm to 460 nm.

TABLE 6

| | 2700K light emitting device phosphor composition | | | | | |
|---|---|---|---|---|---|---|
| | Phosphor composition (wt. %) | | | | | Total phosphor |
| | Red phosphor | Yellow to Green phosphor | Narrow-band red phosphor | wt % CASN of total | wt % KSF of total | per 100 g |
| Device | CASN615 | YAG543 | KSF | red phosphor | red phosphor | silicone (g) |
| Dev. 2 | 1.5 | 23.9 | 74.6 | 2.0 | 98.0 | 129.9 |
| Dev. 3 | 2.1 | 28.2 | 69.7 | 2.9 | 97.1 | 128.7 |
| Dev. 4 | 3.1 | 34.4 | 62.5 | 4.7 | 95.3 | 134.2 |

Table 7 tabulates measured PCT2835 cavity test data for light emitting devices Com.1 and Dev. 2 to Dev.4 under test (drive) conditions $I_F$=100 mA, $V_F$≈9.0V (900 mW) and illustrates the effect on optical performance of the proportion (wt %) of red phosphor (CASN615) out of the total red phosphor content (i.e. CASN615+KSF).

Referring to Table 7, it is noted that the devices in accordance with the invention comprising a mixture of a red phosphor (CASN615) and narrow-band red phosphor (KSF) exhibit an increase in Conversion Efficiency (CE) of between 2.5% and 8.8% compared with the comparative device Com.1 that comprises KSF phosphor alone. In terms of color rendering, it can be seen that by increasing the relative amount of red phosphor (CASN615) this results in a decrease in CRI Ra (96.8→86.7), a decrease in CRI R8 (95.8→74.0) and a decrease CRI R9 (83.7→35.0). The data indicates that a device having between 2.9 wt % (Dev.3) and 4.7 wt % (Dev.4) red phosphor (CASN) out of the total red phosphor content will produce white light that most closely meet the current standards of CRI Ra of about 90, a CRI R8 of about 72 and a CRI R9 of about 50 and have a conversion efficiency of between about 106.5% and 108.8% and a luminous efficacy of between 102.3% and 103.9%. From the data presented in Table 7, it will be appreciated that Dev.3 generates white light that exhibits color rendering that most closely matches the current standards for CRI Ra, CRI R8 and CRI R9. In summary, devices in accordance with the invention can be configured to produce white light meeting current standards while maximizing conversion efficiency/luminous efficacy. In particular, a device having about 3.0 wt % red phosphor (CASN) out of the total red phosphor content will produce white light that closely meets the current standards of CRI Ra of about 90, a CRI R8 of about 72 and a CRI R9 of about 50 while maximizing conversion efficiency/luminous efficacy.

Figure 4:
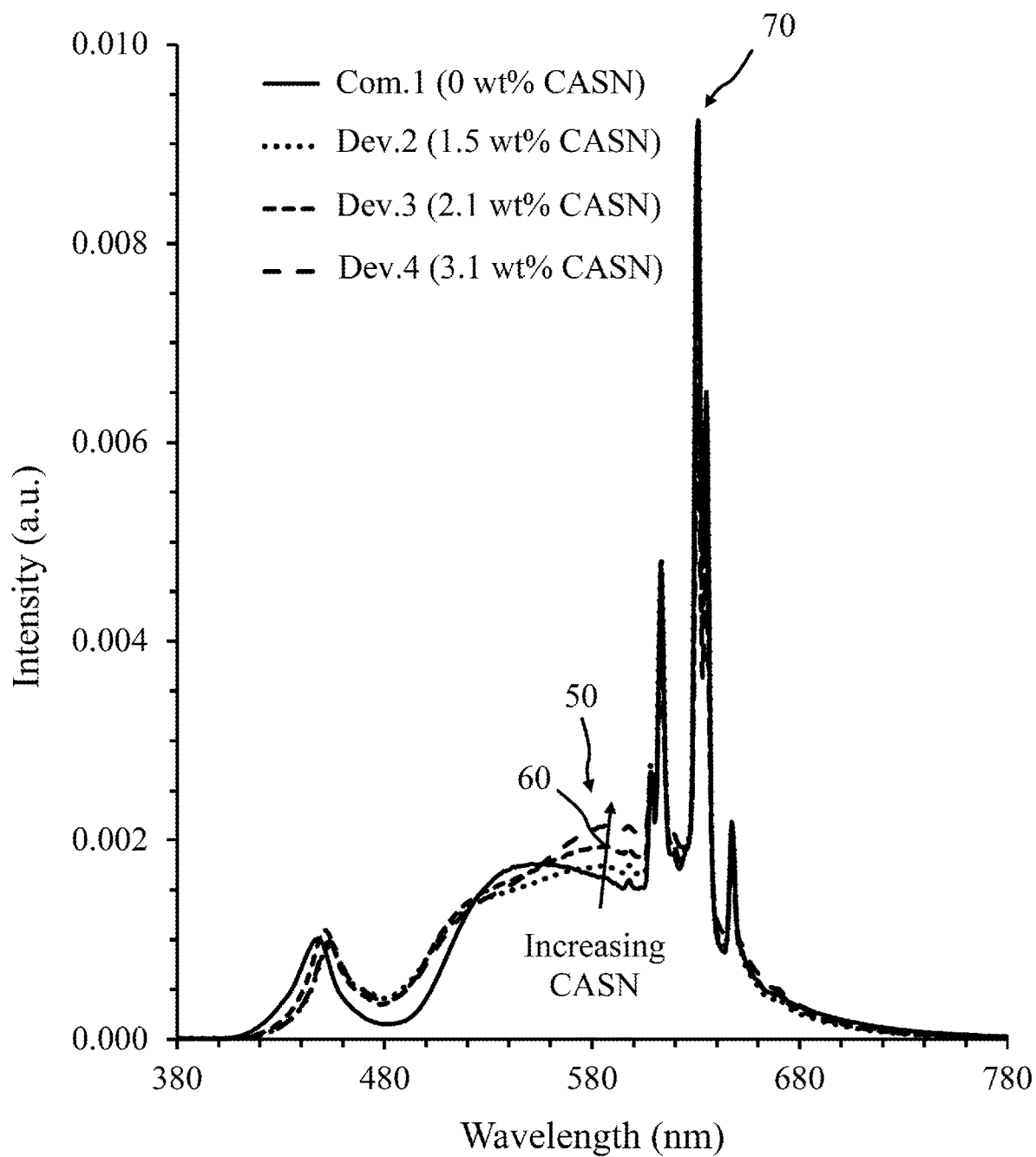
FIG. 4 shows measured emission spectra for light emitting devices Com. 1 and Dev.2-4.

FIG. 4 shows measured emission spectra for light emitting devices Com. 1 and Dev.2-4 and indicate the visual effect on spectrum of varying the proportion of red phosphor (CASN) out of the total red phosphor content (CASN+KSF). Comparing the emission spectra, it can be seen that the addition of a red phosphor (CASN) has two effects: i) it increases the energy content (intensity) of the spectrum at wavelength between 560 nm and 600 nm as indicated by call-out 50 in FIG. 4 and ii) it increases the wavelength of the broad emission peak 60 from about 550 nm (Com.1-no CASN) to from about 580 nm to about 587 nm (about 585 nm). Additionally, it is to be noted that the ratio of the peak emission intensity of the broad peak (resulting from a combination of the yellow to green phosphor and red phosphor (CASN)) to the peak emission intensity of the narrow-band peak 70 (resulting from the narrow-band red phosphor (KSF)) are about 19% (Dev.2), 25% (Dev.3), and 33% (Dev.4). As described herein, devices having about 3.0 wt % red phosphor (CASN) out of the total red phosphor content can produce white light that closely meets the current standards of CRI Ra of about 90, a CRI R8 of about 72 and a CRI R9 of about 50 while maximizing conversion efficiency/luminous efficacy. For such devices the ratio of the peak emission intensity of the broad peak to the peak emission intensity of the narrow-band peak is about 25%. It is believed that such a spectral characteristic-white light having a first emission peak from about 580 nm to about 587 nm and a second emission peak at about 632 nm, wherein the ratio of the peak emission intensity of the first peak to the peak emission intensity of the second peak is in a range 20% to 30%—results in the superior color rendering (CRI Ra, CRI R8 and CRI R9) of the devices of the invention.

TABLE 7

2700K light emitting device - Measured test data for PCT2835 cavity test

| Device | Flux (lm) | CE (lm/W) | CE (%) | LE (lm/W$_{opt}$) | LE (%) | CIE x | CIE y | CCT (K) | Ra | R8 | R9 |
|---|---|---|---|---|---|---|---|---|---|---|---|
| Com. 1 | 116.4 | 129.8 | 100.0 | 343.6 | 100.0 | 0.4512 | 0.4196 | 2996 | 89.8 | 94.5 | 86.0 |
| Dev. 2 | 119.8 | 131.6 | 102.5 | 343.3 | 99.9 | 0.4530 | 0.4180 | 2868 | 96.8 | 95.8 | 83.7 |
| Dev. 3 | 124.5 | 135.3 | 106.5 | 351.8 | 102.3 | 0.4495 | 0.4237 | 2953 | 91.5 | 85.3 | 58.9 |
| Dev. 4 | 127.1 | 138.2 | 108.8 | 356.9 | 103.9 | 0.4500 | 0.4250 | 2956 | 86.7 | 74.0 | 35.0 |

4000 K Light Emitting Devices

Table 8 tabulates phosphor compositions for nominal 4000K light emitting devices for a comparative device (4000K, CRI Ra 85), denoted Com.2, comprising a mixture of YAG535 and CASN628 and a light emitting device in accordance with the invention, denoted Dev.5, comprising a mixture of YAG535, CASN615 and KSF.

As can be seen from Table 8, in terms of phosphor composition: Com.2 comprises 92.9 wt % YAG535 ($\lambda_{pe}$=535 nm)+7.1 wt % CASN628 (Ca$_{1-x}$Sr$_x$AlSiN$_3$:Eu, $\lambda_{pe}$=628 nm, FWHM=81 nm) and Dev.5 comprises 1.4 wt % CASN615 ($\lambda_{pe}$=615 nm)+30.5 wt % YAG543 ($\lambda_{pe}$=543 nm)+68.1 wt % KSF. Each of Com.2 and Dev.5 comprises a PPA2835 (2.8 mm by 3.5 mm) cavity containing one 1133 (0.011" by 0.033") LED die with a dominant wavelength ($\lambda_d$) of 454 nm.

TABLE 8

4000K light emitting device phosphor composition

| | Phosphor composition (wt. %) | | | | | | |
|---|---|---|---|---|---|---|---|
| | Red phosphor | | Yellow to Green phosphor | Narrow-band red phosphor | wt % CASN of total | wt % KSF of total | Total phosphor per 100 g |
| Device | CASN615 | CASN628 | YAG535 | KSF | red phosphor | red phosphor | silicone (g) |
| Com. 2 | — | 7.1 | 92.9 | — | 100.0 | 0.0 | 24.2 |
| Dev. 5 | 1.4 | — | 30.5 | 68.1 | 2.0 | 98.0 | 66.7 |

Table 9 tabulates measured cavity test data for a PPA2835 cavity for light emitting devices Com.2 and Dev. 5 under test (drive) conditions I$_F$=60 mA, V$_F$≈2.9V (174 mW) and illustrates the effect on optical performance of using a combination of a red phosphor (CASN) and narrow-band red phosphor (KSF) compared with using a red phosphor (CASN) alone. First, it is noted that the device (Dev.5) in accordance with the invention comprising a combination of a red phosphor (CASN615) and a narrow-band red phosphor (KSF), exhibits a 2.4% increase in Conversion Efficiency (CE) (158.6 lm/W→162.0 lm/W) and a 1.6% increase in Luminous Efficacy (LE) (335.0 lm/W$_{opt}$→340.5 lm/W$_{opt}$) compared with the comparative device (Com.2) that comprises a red phosphor (CASN) alone. Second, in terms of color rendering, device Dev.5 produces white light with a CRI Ra of 93, a CRI R8 of 91.4 and a CRI R9 of 72.4 exceeding the current standards in lighting. In contrast, the comparative device Com.2 produces white light with a CRI Ra of 83.3, a CRI R8 of 65.0 and a CRI R9 of 8.6 and in terms of color rendering fails to meet any of the standards. Moreover, it will be appreciated that the device in accordance with the invention not only produces light meeting current standards but also exhibits an increase in conversion efficiency/luminous efficacy.

Table 10 tabulates measured test data for a PPA2835 cavity for light emitting devices Com.2 and Dev. 5 under test (drive) conditions $I_F$=120 mA, $V_F$≈3.1V (372 mW) and illustrates the effect on optical performance of using a combination of a red phosphor (CASN) and narrow-band red phosphor (KSF) compared with using a red phosphor (CASN) alone. First, it is noted that the device (Dev.5) in accordance with the invention comprising a combination of a red phosphor (CASN615) and a narrow-band red phosphor (KSF), exhibits a 3.4% increase in Conversion Efficiency (CE) (133.8 lm/W→137.8 lm/W) and a 1.6% increase in Luminous Efficacy (LE) (335.2 lm/W$_{opt}$→340.5 lm/W$_{opt}$) compared with the comparative device (Com.2) that comprises a red phosphor (CASN) alone. Second, in terms of color rendering device Dev.5 produces white light with a CRI Ra of 91.5, a CRI R8 of 89.3 and a CRI R9 of 65.1 exceeding the current standards in lighting. In contrast, the comparative device Com.2 produces white light with a CRI Ra of 82.8, a CRI R8 of 64.8 and a CRI R9 of 6.6 and in terms of color rendering fails to meet any of the standards. Moreover, it will be appreciated that the device in accordance with the invention not only produces light meeting current standards but also exhibits an increase in conversion efficiency/luminous efficacy.

TABLE 10

4000K light emitting device - Measured test data for PPA2835 cavity test ($I_F$ = 120 mA, $V_F$ = 3.1 V)

| Device | Flux (lm) | CE (lm/W) | CE (%) | LE (lm/W$_{opt}$) | LE (%) | CIE x | CIE y | CCT (K) | CRI Ra | R8 | R9 |
|---|---|---|---|---|---|---|---|---|---|---|---|
| Com. 2 | 49.9 | 133.8 | 100.0 | 335.2 | 100.0 | 0.3781 | 0.3845 | 4119 | 82.8 | 64.8 | 6.6 |
| Dev. 5 | 51.6 | 137.8 | 103.4 | 340.5 | 101.6 | 0.3723 | 0.3942 | 4334 | 91.5 | 89.3 | 65.1 |

Figure 5:
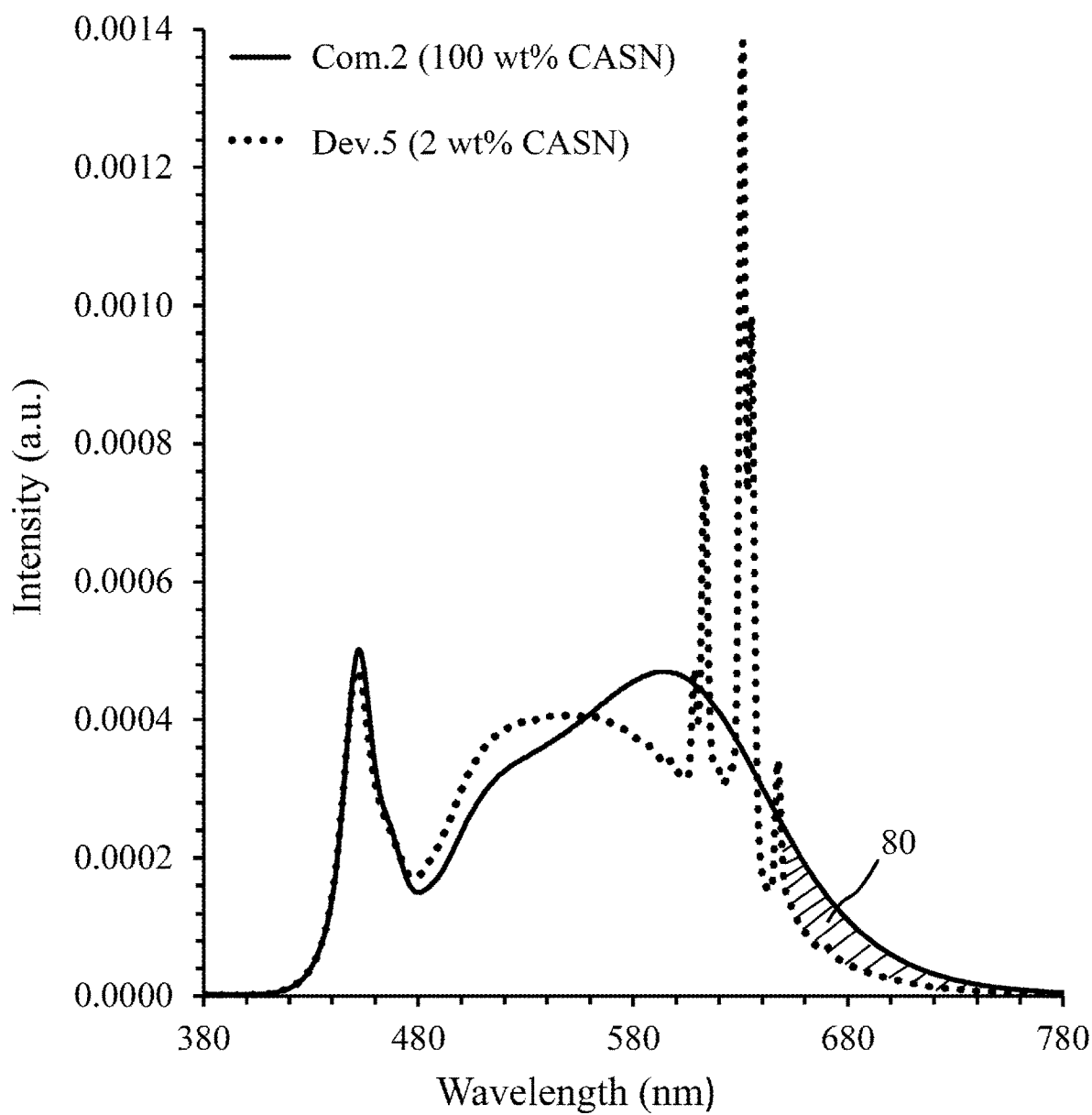
FIG. 5 shows measured emission spectra for light emitting devices Com.2 and Dev.5.

FIG. 5 shows measured emission spectra for light emitting devices Com.2 and Dev.5 and indicate the visual effect on spectrum of the inclusion of the narrow-band red photoluminescence material (KSF). Comparing the emission spectra, it can be seen that the addition of a narrow-band red phosphor (KSF) reduces the energy content of the emission spectrum at wavelength above about 640 nm as indicated by cross-hatched area 80. It is believed that the reduction in energy content for wavelength longer than 640 nm resulting from the inclusion of the narrow-band red phosphor (KSF) accounts for the increased luminous efficacy of the devices of the invention.

5000 K Light Emitting Devices

Table 11 tabulates phosphor compositions for a nominal 5000 K light emitting devices for a light emitting device in accordance with the invention, denoted Dev.6, comprising a mixture of YAG543, CASN615 and KSF.

As can be seen from Table 11, in terms of phosphor composition, Dev.6 comprises 0.8 wt % CASN615 ($\lambda_{pe}$=615 nm)+33.3 wt % YAG543 ($\lambda_{pe}$=543 nm)+65.9 wt % KSF. Dev.6 comprises a PCT2835 (2.8 mm by 3.5 mm) cavity containing three 1133 (0.011" by 0.033") LED dies with a dominant wavelength ($\lambda_d$) of 455 nm to 460 nm.

TABLE 9

4000K light emitting device - Measured test data for PPA2835 cavity

| Device | Flux (lm) | CE (lm/W) | CE (%) | LE (lm/W$_{opt}$) | LE (%) | CIE x | CIE y | CCT (K) | CRI Ra | R8 | R9 |
|---|---|---|---|---|---|---|---|---|---|---|---|
| Com. 2 | 27.5 | 158.6 | 100.0 | 335.0 | 100.0 | 0.3784 | 0.3844 | 4112 | 83.3 | 65.0 | 8.6 |
| Dev. 5 | 28.1 | 162.0 | 102.4 | 340.5 | 101.6 | 0.3723 | 0.3942 | 4334 | 93.0 | 91.4 | 72.4 |

TABLE 11

5000K light emitting device phosphor composition

| Device | Phosphor composition (wt. %) | | | wt % CASN of total red phosphor | wt % KSF of total red phosphor | Total phosphor per 100 g silicone (g) |
| --- | --- | --- | --- | --- | --- | --- |
| | Red phosphor CASN615 | Yellow to Green phosphor YAG543 | Narrow-band red phosphor KSF | | | |
| Dev. 6 | 0.8 | 33.3 | 65.9 | 1.2 | 98.8 | 52.6 |

Table 12 tabulates measured test data for a PPA2835 cavity for light emitting devices Dev. 5 under test (drive) conditions $I_F$=100 mA, $V_F$=9.13V (913 mW). Table 12 also tabulates measured test data for a PPA2835 cavity for light emitting device Com.1 (2700K) under test (drive) conditions $I_F$=100 mA, $V_F$≈9.0V (900 mW)). The measured test data indicates the effect on optical performance of using a combination of a red phosphor (CASN) and narrow-band red phosphor (KSF) compared with using a narrow-band red phosphor (KSF) alone. First, it is noted that the device (Dev.6) in accordance with the invention comprising a combination of a red phosphor (CASN615) and a narrow-band red phosphor (KSF), exhibits a 9.5% increase in Conversion Efficiency (CE) (129.2 lm/W→140.2 lm/W) and a 3.7% decrease (335.2 lm/W$_{opt}$→340.5 lm/W$_{opt}$) in Luminous Efficacy (LE) compared with the comparative device (Com.21) that comprises a narrow-band red phosphor (KSF) alone. The decrease in LE can be attributed to the different color temperature (2700K) of the comparative device. Second, in terms of color rendering, device Dev.6 produces white light with a CRI Ra of 92.6, a CRI R8 of 90.9 and a CRI R9 of 72 exceeding the current standards in lighting.

TABLE 12

5000K light emitting device - Measured test data PPA2835 cavity test ($I_F$ = 100 mA, $V_F$ = 9.1 V)

| Device | Flux (lm) | CE (lm/W) | CE (%) | LE (lm/W$_{opt}$) | LE (%) | CIE x | CIE y | CCT (K) | CRI Ra | R8 | R9 |
| --- | --- | --- | --- | --- | --- | --- | --- | --- | --- | --- | --- |
| Com. 1 | 116.4 | 129.2 | 100.0 | 343.6 | 100.0 | 0.4512 | 0.4196 | 2996 | 89.8 | 94.5 | 86.0 |
| Dev. 6 | 127.9 | 140.2 | 109.5 | 330.8 | 96.3 | 0.3338 | 0.3645 | 5458 | 92.6 | 90.9 | 72.0 |

Maximizing Luminous Efficacy while Meeting CRI Standards

As described above it is possible with light emitting devices in accordance with the invention to not only meet current CRI standards but to also maximize luminous efficacy.

Table 13 tabulates phosphor compositions for nominal 2700K PCT 2835 packaged light emitting devices for a comparative device (2700K, CRI Ra 90), denoted Com.3, comprising a mixture of GAL535 and CASN628 and a light emitting device in accordance with the invention, denoted Dev.7, comprising a mixture of YAG543, CASN615 and KSF.

As can be seen from Table 13, in terms of phosphor composition: Com.3 comprises 91.7 wt % GAL535 ($Lu_{3-x}(Al_{1-y}Ga_y)_5O_{12}:Ce_x$, $\lambda_{pe}$=535 nm)+8.3 wt % CASN628 ($Ca_{1-x}Sr_xAlSiN_3$:Eu, $\lambda_{pe}$=628 nm, FWHM>80 nm) and Dev.7 comprises 2.1 wt % CASN615 ($Ca_{1-x}Sr_xAlSiN_3$:Eu, $\lambda_{pe}$=615 nm, FWHM 74 to 75 nm)+30.0 wt % YAG543 ($\lambda_{pe}$=543 nm)+67.9 wt % KSF. In Dev.7 the wt % of red phosphor (CASN) out of the total red phosphor content (CASN+KSF) is 3.0 wt %. Each of Com.3 and Dev.7 comprise a PCT2835 (2.8 mm by 3.5 mm) package containing three 1133 (0.011" by 0.033") LED dies with a dominant wavelength ($\lambda_d$) of 451.8 nm.

TABLE 13

2700K PCT 2835 packaged light emitting device phosphor composition

| | Phosphor composition (wt. %) | | | | | wt % CASN of total | wt % KSF of total | Total phosphor per 100 g |
|---|---|---|---|---|---|---|---|---|
| | Red phosphor | | Yellow to Green phosphor | | Narrow-band red phosphor | | | |
| Device | CASN615 | CASN628 | GAL535 | YAG543 | KSF | red phosphor | red phosphor | silicone (g) |
| Com. 3 | — | 8.3 | 91.7 | — | — | 100.0 | 0.0 | 45.0 |
| Dev. 7 | 2.1 | — | — | 30.0 | 67.9 | 3.0 | 97.0 | 130.0 |

Table 14 tabulates measured PCT2835 packaged test data for light emitting devices Com.3 and Dev. 4 and illustrates the effect on optical performance of using a combination of a red phosphor (CASN) and narrow-band red phosphor (KSF) compared with using a red phosphor (CASN) alone. First, it is to be noted that the device (Dev.7) in accordance with the invention comprising a combination of a red phosphor (CASN615) and a narrow-band red phosphor (KSF), exhibits a 5.2% increase in Conversion Efficiency (CE) (245.4 lm/W 258.0 lm/W) and a 6.1% increase in Luminous Efficacy (LE) (330.1 lm/W$_{opt}$→350.1 lm/W$_{opt}$) compared with the comparative device (Com.3) that in terms of red photoluminescence material comprises a red phosphor (CASN) alone. Second, in terms of color rendering, device Dev.7 produces white light with a CRI Ra of 90.0, a CRI R8 of 86.2 and a CRI R9 of 60.0 closely meeting the current standards in lighting, Energy Star (CRI Ra≥90), California Energy Commission Title 20 code (72 minimum CRI R8) and California Energy Commission Title 24 code (50 minimum CRI R9) with a luminous efficacy of greater than 350 lm/W. In contrast, the comparative device Com.3 produces white light with a CRI Ra of 80.7, a CRI R8 of 53.0 and a CRI R9 of −2.1 that fails to meet the standards and has a lower a luminous efficacy of only about 330 lm/W. It will be appreciated that the device in accordance with the invention not only produces light meeting current standards but also exhibits a significant increase in conversion efficiency/luminous efficacy.

TABLE 14

2700K PCT 2835 packaged light emitting device - Measured test data (LED $\lambda_d$ = 451.8 nm)

| Device | Flux (lm) | CE (lm/W) | CE (%) | LE (lm/W$_{opt}$) | LE (%) | CIE x | CIE y | CCT (K) | CRI Ra | R8 | R9 |
|---|---|---|---|---|---|---|---|---|---|---|---|
| Com. 3 | 108.0 | 245.4 | 100.0 | 330.1 | 100.0 | 0.4562 | 0.4063 | 2718 | 80.7 | 53.0 | −2.1 |
| Dev. 7 | 113.6 | 258.0 | 105.2 | 350.1 | 106.1 | 0.4443 | 0.4181 | 2991 | 90.0 | 86.2 | 60.0 |

Table 15 tabulates phosphor compositions for nominal 2700K light emitting devices for a comparative device (2700K, CRI Ra 90), denoted Com.4, comprising a mixture of GAL535 and CASN628 and a light emitting device in accordance with the invention, denoted Dev.8, comprising a mixture of GAL540, XR600 and KSF.

As can be seen from Table 15, in terms of phosphor composition: Com.4 comprises 92.0 wt % GAL535+8.0 wt % CASN628 (Ca$_{1-x}$Sr$_x$AlSiN$_3$:Eu, $\lambda_{pe}$=628 nm, FWHM>80 nm) and Dev.8 comprises 6.5 wt % XR600 (Ba$_{2-x}$Sr$_x$Si$_5$N$_8$:Eu, $\lambda_{pe}$=600 nm, FWHM≈79 nm)+28.0 wt % GAL540 ($\lambda_{pe}$=540 nm)+65.5 wt % KSF. In Dev.8 the wt % of red phosphor (CASN) out of the total red phosphor content (CASN+KSF) is 9.0 wt %. Each of Com.4 and Dev.8 comprise a 5630 (5.6 mm by 3.0 mm) cavity containing a single LED die with a dominant wavelength ($\lambda_d$) of 452.4 nm.

TABLE 15

2700K light emitting device phosphor composition

| | Phosphor composition (wt. %) | | | | | wt % CASN of total | wt % KSF of total | Total phosphor per 100 g |
|---|---|---|---|---|---|---|---|---|
| | Red phosphor | | Yellow to Green phosphor | | Narrow-band red phosphor | | | |
| Device | XR600 | CASN628 | GAL535 | GAL540 | KSF | red phosphor | red phosphor | silicone (g) |
| Com. 4 | — | 8.0 | 92.0 | — | — | 100.0 | 0.0 | 60.0 |
| Dev. 8 | 6.5 | — | — | 28.0 | 65.5 | 9.0 | 91.0 | 100.0 |

Table 16 tabulates measured 5630 cavity test data for light emitting devices Com.4 and Dev. 8 and illustrates the effect on optical performance of using a combination of a red phosphor (XR-258 nitride) and narrow-band red phosphor (KSF) compared with using a red phosphor (CASN) alone. First, it is to be noted that the device (Dev.8) in accordance with the invention comprising a combination of a red phosphor (XR600) and a narrow-band red phosphor (KSF), exhibits a 2.0% increase in Conversion Efficiency (CE) (243.2 lm/W→248.1 lm/W) and a 4.7% increase in Luminous Efficacy (LE) (331.1 lm/$W_{opt}$→346.5 lm/$W_{opt}$) compared with the comparative device (Com.4) that in terms of red photoluminescence material comprises a red phosphor (CASN) alone. Second, in terms of color rendering, device Dev.8 produces white light with a CRI Ra of 89.0, a CRI R8 of 83.1 and a CRI R9 of 58.7 closely meeting the current standards in lighting, Energy Star (CRI Ra≥90), California Energy Commission Title 20 code (72 minimum CRI R8) and California Energy Commission Title 24 code (50 minimum CRI R9) with a luminous efficacy of greater than 350 lm/W. In contrast, the comparative device Com.4 produces white light with a CRI Ra of 82.5, a CRI R8 of 55.5 and a CRI R9 of 4.0 that fail to meet the standards and have a lower a luminous efficacy of only about 331 lm/W. It will be appreciated that the device in accordance with the invention not only produces light meeting current standards but also exhibits a significant increase in conversion efficiency/luminous efficacy.

TABLE 16

2700K light emitting device - Measured test data for 5630 cavity (LED $\lambda_d$ = 452.4 nm)

| Device | Flux (lm) | CE (lm/W) | CE (%) | LE (lm/$W_{opt}$) | LE (%) | CIE x | CIE y | CCT (K) | CRI Ra | R8 | R9 |
|---|---|---|---|---|---|---|---|---|---|---|---|
| Com. 4 | 18.0 | 243.2 | 100.0 | 331.1 | 100.0 | 0.4620 | 0.4145 | 2701 | 82.5 | 55.5 | 4.0 |
| Dev. 8 | 18.4 | 248.1 | 102.0 | 346.5 | 104.7 | 0.4622 | 0.4148 | 2700 | 89.0 | 83.1 | 58.7 |

Table 17 tabulates phosphor compositions for nominal 2700K light emitting devices for comparative devices (2700 K, CRI Ra 90), denoted Com.5 and Com.6, which respectively comprises a mixture of a yellow to green phosphor and CASN and KSF respectively and light emitting devices in accordance with the invention, denoted Dev.9 and Dev.10, comprising a mixture of GAL543, XR600 and KSF.

As can be seen from Table 17, in terms of phosphor composition: Com.5 comprises 91.7 wt % GAL535+8.3 wt % CASN628, Com.6 comprises 19.0 wt % YAG558+81.0 wt % KSF, Dev.9 comprises 5.6 wt % XR600+27.0 wt % YAG543+66.4 wt % KSF and Dev.10 comprises 8.9 wt % XR600+26.0 wt % YAG543+65.1 wt % KSF. The wt % of red phosphor (XR600) out of the total red phosphor content (XR600+KSF) is 9.0 wt % in Dev.9 and 12.0 wt % in Dev.10. Each of Com.4, Com.5, Dev.9 and Dev.10 comprise a 2835 (2.8 mm by 3.5 mm) package containing three 1133 (0.011" by 0.033") LED dies with a dominant wavelength ($\lambda_d$) of 453 nm.

TABLE 17

2700K 2835 packaged light emitting device phosphor composition

| | Phosphor composition (wt. %) | | | | | | | |
|---|---|---|---|---|---|---|---|---|
| | Red phosphor | | Yellow to Green phosphor | | | Narrow-band red phosphor | wt % CASN of total red phosphor | wt % KSF of total red phosphor | Total phosphor per 100 g silicone (g) |
| Device | XR600 | CASN628 | GAL535 | YAG543 | YAG558 | KSF | | | |
| Com. 5 | — | 8.3 | 91.7 | — | — | — | 100.0 | 0.0 | 45.0 |
| Com. 6 | — | — | — | — | 19.0 | 81.0 | 0.0 | 100.0 | 100.0 |
| Dev. 9 | 5.6 | — | — | 27.0 | — | 66.4 | 9.0 | 91.0 | 75.0 |
| Dev. 10 | 8.9 | — | — | 26.0 | — | 65.1 | 12.0 | 88.0 | 75.0 |

Table 18 tabulates measured 2835 packaged test data for light emitting devices Com.5, Com.6, Dev.9 and Dev.10 and illustrates the effect on optical performance of using a combination of a red phosphor (XR-258 nitride) and narrow-band red phosphor (KSF) compared with using a red phosphor (CASN) alone Com.5. First, it is to be noted that devices (Dev.9 and Dev.10) in accordance with the invention comprising a combination of a red phosphor (XR600) and a narrow-band red phosphor (KSF), respectively exhibit a 1.5 and 3.8% increase in Conversion Efficiency (CE) and a 2.2% and 2.7% increase in Luminous Efficacy (LE) (330.2 lm/$W_{opt}$→337.4 lm/$W_{opt}$ and 339.1 lm/$W_{opt}$) compared with the comparative device (Com.5) that in terms of red photoluminescence material comprises a red phosphor (CASN) alone. Second, in terms of color rendering, devices Dev.9 and Dev.10 respectively produce white light with a CRI Ra of 92.6 and 88.5, a CRI R8 of 86.2 and 79.2 and a CRI R9 of 66.5 and 50.4 and each closely meets the current standards in lighting, Energy Star (CRI Ra≥90), California Energy Commission Title 20 code (72 minimum CRI R8) and California Energy Commission Title 24 code (50 minimum CRI R9) with a luminous efficacy of greater than 337 lm/W. In contrast, the comparative device Com.5 produces white light with a CRI Ra of 80.7, a CRI R8 of 52.6 and a CRI R9 of −2.0 that fail to meet the standards and has a lower luminous efficacy of only about 330 lm/W. It will be appreciated that the device in accordance with the invention not only produces light meeting current standards but also exhibits an increase in conversion efficiency/luminous efficacy.

TABLE 18

| 2700K 2835 packaged light emitting device - Measured test data (LED $\lambda_d$ = 453.0 nm) | | | | | | | | | |
|---|---|---|---|---|---|---|---|---|---|
| | Flux | CE | LE | LE | | | CCT | CRI | |
| Device | (lm) | (%) | (lm/$W_{opt}$) | (%) | CIE x | CIE y | (K) | Ra | R8 | R9 |
| Com. 5 | 106.6 | 100.0 | 330.2 | 100.0 | 0.4593 | 0.4079 | 2687 | 80.7 | 52.6 | −2.0 |
| Com. 6 | 104.3 | 97.8 | 336.4 | 101.9 | 0.4551 | 0.4104 | 2766 | 89.9 | 90.4 | 96.3 |
| Dev. 9 | 101.5 | 101.5 | 337.4 | 102.2 | 0.4577 | 0.4098 | 2724 | 92.6 | 86.2 | 66.5 |
| Dev. 10 | 103.8 | 103.8 | 339.1 | 102.7 | 0.4546 | 0.4072 | 2749 | 88.5 | 79.2 | 50.4 |

In summary, it will be appreciated that devices in accordance with the invention can be configured to produce white light with a color temperature between about 2700K to 5000K that meet current standards for CRI Ra, CRI R8 and CRI R9 and have a conversion efficiency (CE) and luminous efficacy (LE) (330 lm/W to 350+ lm/W depending on color temperature) that are superior than those of known devices. More particularly, devices having between about 1.0 wt % and about 12 wt %, more particularly between about 1.0 wt % and about 5 wt %, red photoluminescence material (e.g. CASN) out of the total red photoluminescence material content (red photoluminescence material+narrow-band red photoluminescence material e.g. CASN+KSF) can produce white light that meet the current standards of CRI Ra of about 90, a CRI R8 of about 72 and a CRI R9 of about 50 and have a conversion efficiency/luminous that are superior known devices. Moreover, the invention provides a white emitting device that has an optimal luminous efficacy (350+ lm/W) while meeting current standards for CRI Ra, CRI R8 and CRI R9 by the inclusion of about 3.0 wt % red photoluminescence material (e.g. CASN) out of the total red photoluminescence material content.

Although the present invention has been particularly described with reference to certain embodiments thereof, it should be readily apparent to those of ordinary skill in the art that changes and modifications in the form and details may be made without departing from the spirit and scope of the invention. For example, while in the embodiments the narrow-band red photoluminescence materials are embodied as narrow-band red phosphors, in other embodiments the narrow-band red photoluminescence material can comprise a quantum dot (QD) material.

What is claimed is:

1. A light emitting device that emits white light with a color temperature from 2700K to 5000K and a CRI Ra of at least 90, comprising:
    an LED that generates blue excitation light with a dominant wavelength from 450 nm to 470 nm;
    a broadband red nitride-based phosphor of general composition (Sr,Ca)SiAlN$_3$:Eu which, in response to stimulation by the excitation light, generates light having a peak emission wavelength from 600 nm to 620 nm with a full width at half maximum emission intensity from 70 nm to 80 nm;
    a yellow to green cerium-activated aluminum garnet phosphor which, in response to stimulation by the excitation light, generates light having a peak emission wavelength from 515 nm to 550 nm; and
    a narrowband red manganese-activated fluoride phosphor which, in response to stimulation by the excitation light, generates light having a peak emission wavelength from 625 nm to 635 nm for the highest emission peak with a full width at half maximum emission intensity from about 5 nm to about 25 nm, wherein the narrowband red manganese-activated fluoride phosphor is selected from the group consisting of: K$_2$SiF$_6$:Mn$^{4+}$, K$_2$GeF$_6$:Mn$^{4+}$, and K$_2$TiF$_6$:Mn$^{4+}$;
    wherein when said color temperature is from about 2700K to about 3000K the broadband red nitride-based phosphor comprises about 3 wt % of the combined weight of the broadband red nitride-based and narrowband red manganese-activated fluoride phosphors and the light emitting device has a luminous efficacy from 345 lm/$W_{op}$ to 355 lm/$W_{op}$;
    wherein when said color temperature is about 4000K the broadband red nitride-based phosphor comprises about 2 wt % of the combined weight of the broadband red nitride-based and narrowband red manganese-activated fluoride phosphors and the light emitting device has a luminous efficacy of about 340 lm/$W_{op}$; and
    wherein when said color temperature is about 5000K the broadband red nitride-based phosphor comprises about 1 wt % of the combined weight of the broadband red nitride-based and narrowband red manganese-activated fluoride phosphors and the light emitting device has a luminous efficacy of about 330 lm/$W_{op}$.

2. The light emitting device of claim 1, wherein the broadband red nitride-based phosphor has a peak emission wavelength of about 615 nm.

3. The light emitting device of claim 1, wherein the yellow to green photoluminescence material generates light with a peak emission wavelength selected from the group consisting of: 515 nm to 530 nm, 530 nm to 540 nm, and 540 nm to 550 nm.

4. The light emitting device of claim 1, wherein the yellow to green cerium-activated aluminum garnet phosphor is selected from the group consisting of: $(Y,Lu)_3(Al,Ga)_5O_{12}$:Ce, $Y_3(Al,Ga)_5O_{12}$:Ce, and $Lu_3Al_5O_{12}$:Ce.

5. The light emitting device of claim 1,
wherein when said color temperature is from about 2700K to about 3000K the white light has a spectrum having a broad emission peak at about 565 nm;
wherein when said color temperature is about 4000K the white light has a spectrum having a broad emission peak at about 580 nm; and
wherein when said color temperature is about 5000K the white light has a spectrum having a broad emission peak at about 585 nm.

6. A light emitting device that emits white light with a color temperature from 2700K to 5000K and a CRI Ra of at least 90, comprising:
an LED that generates blue excitation light with a dominant wavelength from 450 nm to 470 nm;
a broadband red nitride-based phosphor of general composition $(Sr,Ca)SiAlN_3$:Eu which in response to stimulation by the excitation light, generates light having a peak emission wavelength from 600 nm to 620 nm with a full width at half maximum emission intensity from 70 nm to 80 nm;
a yellow to green cerium-activated aluminum garnet phosphor which, in response to stimulation by the excitation light, generates light having a peak emission wavelength from 515 nm to 550 nm; and
a narrowband red manganese-activated fluoride phosphor which, in response to stimulation by the excitation light, generates light having a peak emission wavelength from 625 nm to 635 nm for the highest emission peak with a full width at half maximum emission intensity from about 5 nm to about 25 nm, wherein the narrowband red manganese-activated fluoride phosphor is selected from the group consisting of: $K_2SiF_6$:$Mn^{4+}$, $K_2GeF_6$:$Mn^{4+}$, and $K_2TiF_6$:$Mn^{4+}$;
wherein when said color temperature is from about 2700K to about 3000K the white light has a spectrum having a broad emission peak at about 565 nm and the light emitting device has a luminous efficacy from 345 lm/$W_{op}$ to 350 lm/$W_{op}$;
wherein when said color temperature is about 4000K the white light has a spectrum having a broad emission peak at about 580 nm and the light emitting device has a luminous efficacy of about 340 lm/$W_{op}$; and
wherein when said color temperature is about 5000K the white light has a spectrum having a broad emission peak at about 585 nm and the light emitting device has a luminous efficacy of about 330 lm/$W_{op}$.

7. The light emitting device of claim 6, wherein the broadband red nitride-based phosphor has a peak emission wavelength of about 615 nm.

8. The light emitting device of claim 6, wherein the yellow to green photoluminescence material generates light with a peak emission wavelength selected from the group consisting of: 515 nm to 530 nm, 530 nm to 540 nm, and 540 nm to 550 nm.

9. The photoluminescence material composition of claim 6, wherein the yellow to green cerium-activated aluminum garnet phosphor is selected from the group consisting of: $(Y,Lu)_3(Al,Ga)_5O_{12}$:Ce, $Y_3(Al,Ga)_5O_{12}$:Ce, $Lu_3Al_5O_{12}$:Ce.

* * * * *

UNITED STATES PATENT AND TRADEMARK OFFICE
CERTIFICATE OF CORRECTION

| | |
|---|---|
| PATENT NO. | : 10,847,566 B2 |
| APPLICATION NO. | : 16/403723 |
| DATED | : November 24, 2020 |
| INVENTOR(S) | : Gang Wang and Yi-Qun Li |

It is certified that error appears in the above-identified patent and that said Letters Patent is hereby corrected as shown below:

In the Claims

Column 27, Line 16, that portion of Claim 5 reading:
"565 nm"

Should read:
-- 585 nm --

Column 28, Line 12, that portion of Claim 6 reading:
"565 nm"

Should read:
-- 585 nm --

Signed and Sealed this
Eighteenth Day of April, 2023

Katherine Kelly Vidal
*Director of the United States Patent and Trademark Office*